United States Patent
Hyon et al.

(10) Patent No.: US 10,283,391 B2
(45) Date of Patent: May 7, 2019

(54) MULTIPLE GASES PROVIDING METHOD AND MULTIPLE GASES PROVIDING APPARATUS

(71) Applicant: EUGENE TECHNOLOGY CO., LTD., Yongin-si, Gyeonggi-do (KR)

(72) Inventors: Jun-Jin Hyon, Gunpo-si (KR); Joo-Hyun Cho, Yongin-si (KR); Chul-Goo Kang, Seongnam-si (KR); Yong-Ki Kim, Pyeongtaek-si (KR); Jung-Ki Min, Yongin-si (KR)

(73) Assignee: EUGENE TECHNOLOGY CO., LTD., Yongin-si, Gyeonggi-Do (KR)

( * ) Notice: Subject to any disclaimer, the term of this patent is extended or adjusted under 35 U.S.C. 154(b) by 81 days.

(21) Appl. No.: 15/535,380

(22) PCT Filed: Feb. 19, 2016

(86) PCT No.: PCT/KR2016/001686
§ 371 (c)(1),
(2) Date: Jun. 12, 2017

(87) PCT Pub. No.: WO2016/137170
PCT Pub. Date: Sep. 1, 2016

(65) Prior Publication Data
US 2017/0372929 A1    Dec. 28, 2017

(30) Foreign Application Priority Data

Feb. 27, 2015  (KR) .................. 10-2015-0028508

(51) Int. Cl.
*G05D 7/06* (2006.01)
*H01L 21/67* (2006.01)
*H01L 21/02* (2006.01)

(52) U.S. Cl.
CPC ..... *H01L 21/67253* (2013.01); *G05D 7/0652* (2013.01); *G05D 7/0664* (2013.01);
(Continued)

(58) Field of Classification Search
CPC ............ G05D 7/0664; Y10T 137/2657; Y10T 137/7761
See application file for complete search history.

(56) References Cited

U.S. PATENT DOCUMENTS 4,417,312 A * 11/1983 Cronin ................ G01M 3/2807
                                                         137/487.5
6,418,954 B1    7/2002 Taylor et al.
(Continued)

FOREIGN PATENT DOCUMENTS

KR   10-2001-0080530 A   8/2001
KR   10-2004-0004391 A   1/2004
(Continued)

*Primary Examiner* — Kevin F Murphy
(74) *Attorney, Agent, or Firm* — Rabin & Berdo, P.C.

(57) ABSTRACT

Provided is a method for multi-supplying gas, the method comprising: installing a control valve and an flow meter on each of a plurality of branch lines branched from a main supply line, in which one or more gases are supplied, and supplying the gas; and providing the gas by adjusting flow of the gas by a controller connected to each of the control valve and the flow meter, wherein the controller has a first control manner, which controls each of the control valves based on a rate of flow measured by the flow meter to required portion flow for each branch line, and the first control manner adjusts an open rate of the control valve if the rate of the measured flow to the required portion flow is not within a predetermined range, and a unit of adjusting the control valve increases or decreases according to a difference between the measured flow and the required portion flow.

6 Claims, 8 Drawing Sheets

(52) U.S. Cl.
CPC ........ *H01L 21/02* (2013.01); *H01L 21/67017* (2013.01); *Y10T 137/2657* (2015.04)

(56) References Cited

U.S. PATENT DOCUMENTS

| | | | |
|---|---|---|---|
| 6,581,623 B1 * | 6/2003 | Carpenter | B01D 53/0454 137/113 |
| 6,962,164 B2 * | 11/2005 | Lull | G01F 25/0007 137/2 |
| 8,746,275 B2 * | 6/2014 | Santinanavat | F23N 1/002 126/39 BA |
| 2002/0042205 A1 | 4/2002 | McMillin et al. | |
| 2002/0123230 A1 | 9/2002 | Hubacek | |
| 2005/0199342 A1 | 9/2005 | Shajii et al. | |
| 2007/0240778 A1 | 10/2007 | L'Bassi et al. | |

FOREIGN PATENT DOCUMENTS

| | | |
|---|---|---|
| KR | 10-2004-0008129 A | 1/2004 |
| KR | 10-2007-0011342 A | 1/2007 |
| KR | 10-2008-0111075 A | 12/2008 |

* cited by examiner

MULTIPLE GASES PROVIDING METHOD AND MULTIPLE GASES PROVIDING APPARATUS

TECHNICAL FIELD

The present invention disclosed herein relates to a method for multi-supplying gas and an apparatus for multi-supplying gas, and more particularly, to a method and an apparatus for supplying gas via branch lines using control valves and flow meters.

BACKGROUND ART

Recently, silicon wafers used to manufacture a semiconductor have become larger and accordingly, in the semiconductor manufacturing apparatus, supplying reaction gas into a chamber using a plurality of branch lines as well as relatively highly controlling a gas-flow ratio among the respective branch lines has been also required.

DISCLOSURE

Technical Problem

The present invention provides a method for a method for multi-supplying gas and an apparatus for multi-supplying gas, capable of accurately controlling gas supplied via branch lines.

These and other objects of the present invention will be more apparent from the following detailed description and the accompanying drawings.

Technical Solution

Embodiments of the present invention provide a method for multi-supplying gas, the method comprising: installing a control valve and an flow meter on each of a plurality of branch lines branched from a main supply line, in which one or more gases are supplied, and supplying the gas; and providing the gas by adjusting flow of the gas by a controller connected to each of the control valve and the flow meter, wherein the controller has a first control manner, which controls each of the control valves based on a rate of flow measured by the flow meter to required portion flow for each branch line, and the first control manner adjusts an open rate of the control valve if the rate of the measured flow to the required portion flow is not within a predetermined range, and a unit of adjusting the control valve increases or decreases according to a difference between the measured flow and the required portion flow.

In other embodiments, in the first control manner, the unit of adjusting the control valve may be a first adjusting unit when the control valve is in a full open state, the unit of adjusting the control valve may be a second adjusting unit when the control valve is in a full close state, the first and second adjusting units may be larger than the unit of adjusting the control valve between the full open state and the full close state, and the first adjusting unit may be larger than the second adjusting unit.

In still other embodiments, the controller may have a second control manner, in which, if the flow measured by the flow meter for each branch line is equal to or more than the required portion flow by a predetermined value, the controller decreases the open rate of the control valve by a third adjusting unit, and if the flow measured by the flow meter is less than the required portion flow by a predetermined value, the controller increases the open rate of the control valve by the third adjusting unit.

In even other embodiments, the controller may have a third control manner, in which the controller fixes the open rate of the control valve if the flow measured by the flow meter is within a predetermined range in a state that the second control manner is maintained for a predetermined period, and the controller returns to the second control manner if the flow measured by the flow meter is not within the predetermined range.

In yet other embodiments, wherein the controller may have a third control manner, in which the controller fixes the open rate of the control valve if a total of supply flow being the sum of the flow measured by the flow meter is within a predetermined range in a state that the second control manner is maintained for a predetermined period, and the controller returns to the second control manner if the total of supply flow is not within the predetermined range.

In further embodiments, the controller may calculate a total of supply flow, which is the sum of the flow measured by the flow meter, after adjusting each of the control valves to a full open state, and increase an open rate of an flow controller, which is installed on one or more auxiliary supply line connected to the main supply line and adjusts flow of the gas, if the total of supply flow is equal to or less than a total of required flow, which is the sum of the required portion flow, by a predetermined value.

Other embodiments of the present invention provide an apparatus for multi-supplying gas, comprising: a main supply line, in which one or more gases are supplied; a plurality of branch lines branched from the main supply line and providing the gas supplied from the main supply line; a plurality of control valves, each installed on each of the plurality of branch lines; a plurality of flow meters, each installed on each of the plurality of branch lines, located at a rear end of the control valve, and measuring flow of the gas provided via the branch line; and a controller connected to each of the control valve and the flow meter and driving the control valve, wherein the controller has a first control manner, which controls each of the control valves based on a rate of flow measured by the flow meter to required portion flow for each branch line, and the first control manner adjusts an open rate of the control valve if the rate of the measured flow to the required portion flow is not within a predetermined range, and a unit of adjusting the control valve increases or decreases according to a difference between the measured flow and the required portion flow.

Advantageous Effects

According to an embodiment of the present invention, the controller can accurately control the gas supplied via the branch lines. Further, the present invention can accurately controls the flow rate of the gas using the control valve and the flow meter without the separate FRC.

BEST MODE

Hereinafter, preferred examples of the present invention will be described in more detail with reference to the accompanying FIGS. 1 to 8. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Thus, the size of each element may be exaggerated for convenience in description and clarity.

Figure 1:
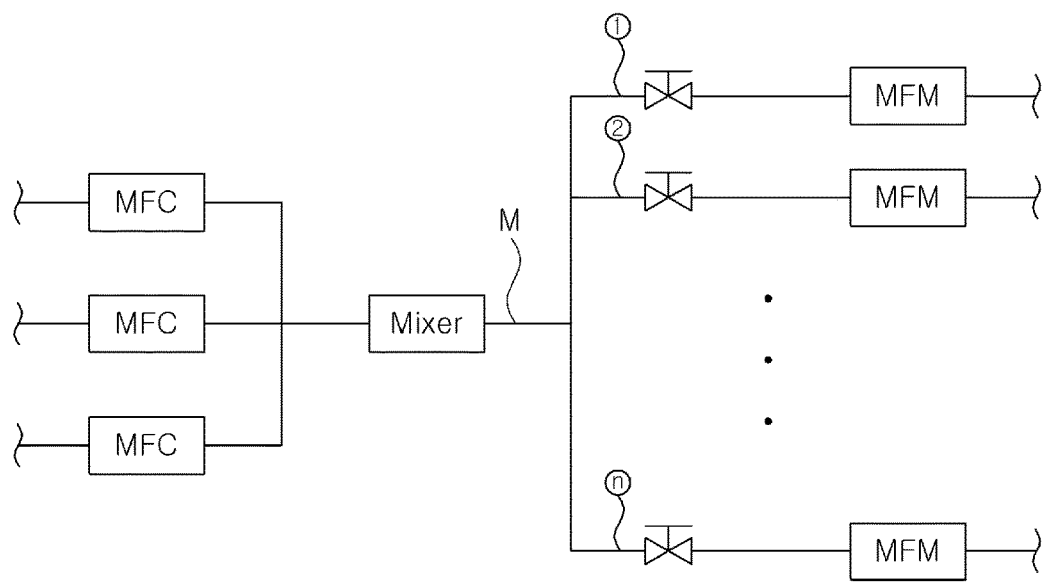
FIGS. 1 and 2 are a diagram schematically illustrating an apparatus for multi-supplying gas according to an embodiment of the present invention.
Figure 2:
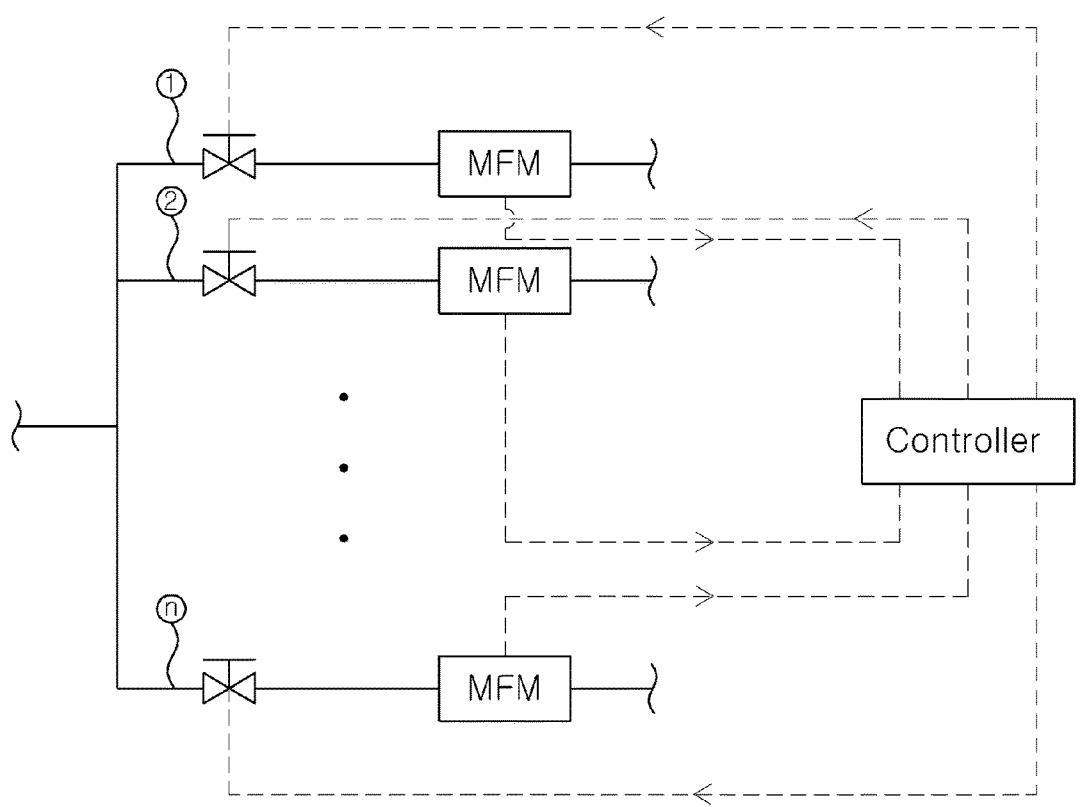

FIGS. 1 and 2 are a diagram schematically illustrating an apparatus for multi-supplying gas according to an embodiment of the present invention. As illustrated in FIG. 1, an apparatus for multi-supplying gas comprises a main supply line M and branch lines ①, ②, . . . , ⓝ. A front end of the main supply line M is connected to auxiliary lines and a rear end of the main supply line M is connected to the branch lines ①, ②, . . . , ⓝ. Different gases can flow in the respective auxiliary lines and the gases, which are supplied to the main supply line M via the respective auxiliary lines, are sufficiently mixed in a mixer and then supplied into the respective branch lines ①, ②, . . . , ⓝ. A MFC (a flow rate controller) is installed on the respective auxiliary lines and controls a flow rate of gas supplied into the mixer via the respective auxiliary lines.

The branch lines ①, ②, . . . , ⓝ is branched from the main supply line M and as illustrated in FIG. 1, comprised of n branch lines. As described the above, the gas mixed in the mixer is flowed in the branch lines ①, ②, . . . , ⓝ and then can be supplied into the desired position via the branch lines ①, ②, . . . , ⓝ.

A control valve and a flow meter (for example, MFM; mass flow meter) are installed on each of the branch lines and each of the control valve and the flow meter is connected to the controller. The flow meter can measure the flow of gas discharged (or supplied) via each branch line and the measured value is transmitted to the controller. The controller controls an open rate of the control valve according to the measured value transmitted from the flow meter and thereby can control the flow of gas discharged via each branch line. The controller may a PLC controller and may control the control valve in a PID manner.

Conventionally, the gas supplied via the main supply line was distributed to the branch lines via a distributor (FRC) but there is a limit that the distributor cannot be used in five (5) or more channels because it has only four (4) channels. However, the above control valve-flow meter manner can implement a function of distribution (FRC) by integrating all channels via the controller. Hereinafter, it will be described with reference to the accompanying FIGS. 3 to 7.

Figure 3:
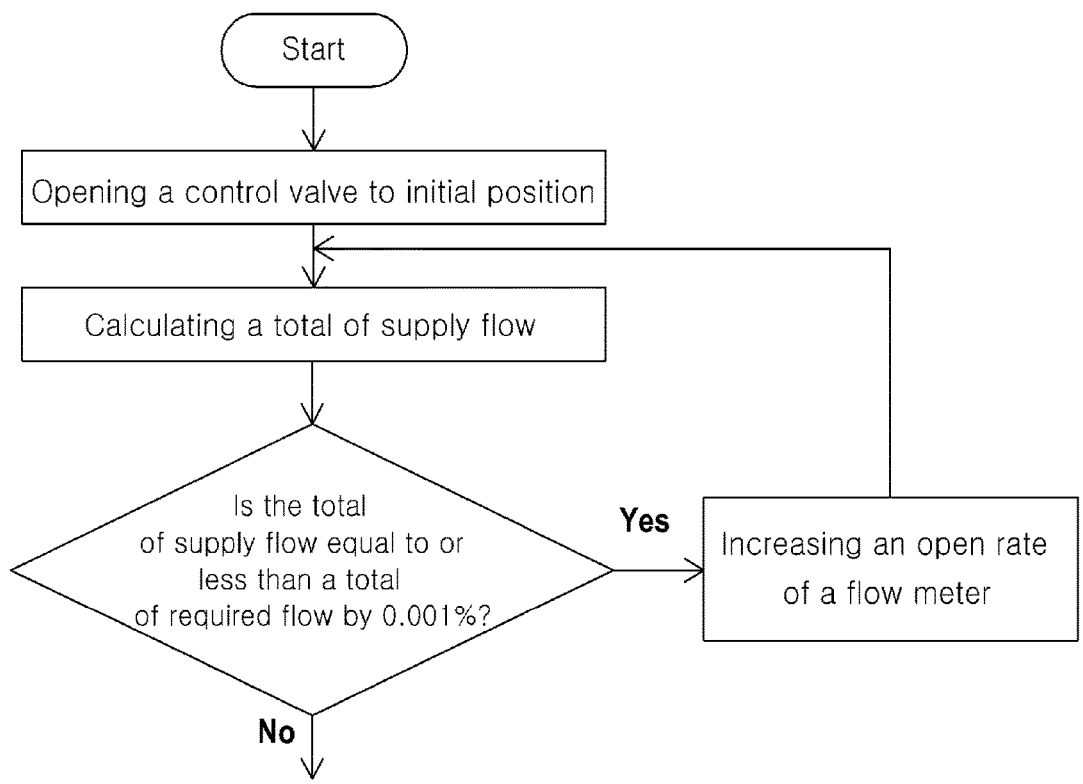
FIG. 3 is a flowchart illustrating an initial-controlling manner of a controller illustrated in FIG. 2.
Figure 4:
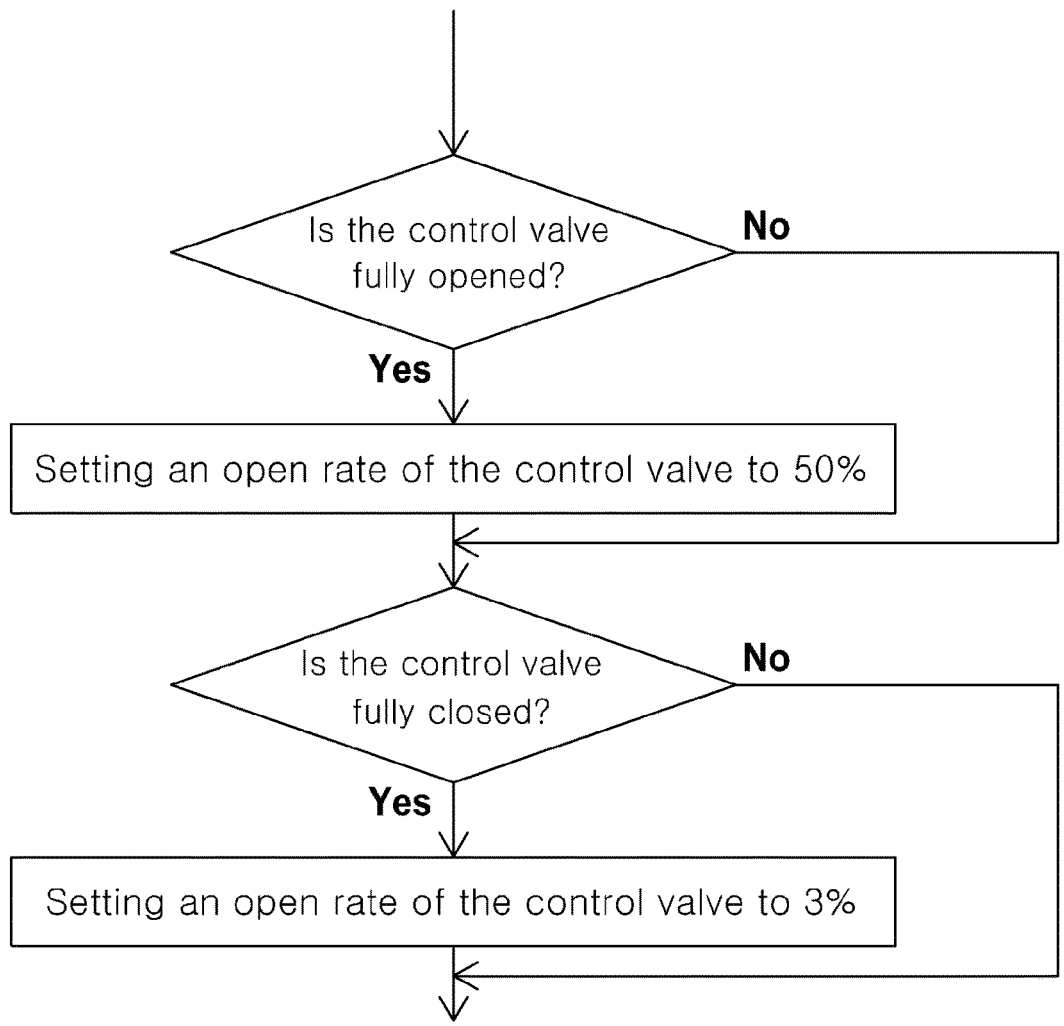
FIGS. 4 and 5 are a flowchart illustrating the first control manner of the controller illustrated in FIG. 2.

FIG. 3 is a flowchart illustrating an initial-controlling manner of a controller illustrated in FIG. 2. First, as illustrated in FIG. 4, the control valve is driven and opens the each branch line (or each channel) to an initial position (for example, full open), and then a total of supply flow is calculated by adding the flow of the branch lines measured via the flow meters located in the rear ends of the control valves. Thereafter, a total of required flow, which is a sum of required portion flow to be supplied via the respective branch lines ①, ②, . . . , ⓝ, is calculated, and then total of supply flow is compared to the total of required flow. If the total of supply flow is equal or less by a predetermined value than the total of required flow, the total of supply flow is increased by increasing the open rate of MFC (the mass flow controller). Therefore, the total of supply flow and the total of required flow can be adjusted to the approximate level.

For example, the predetermined value may be 0.001%. In other words, if the total of supply flow may be smaller than the total of required value and the difference (the total of supply flow—the total of required value) is equal to or larger than 0.001% of the total of required flow, the open rate of the MFC (the mass flow controller) can be increased and thereby the total flow of gas supplied into the main supply line M via the auxiliary supply lines can be increased. Therefore, as described the above, the total of supply flow and the total of required flow can be adjusted to the approximate level.

Figure 5:
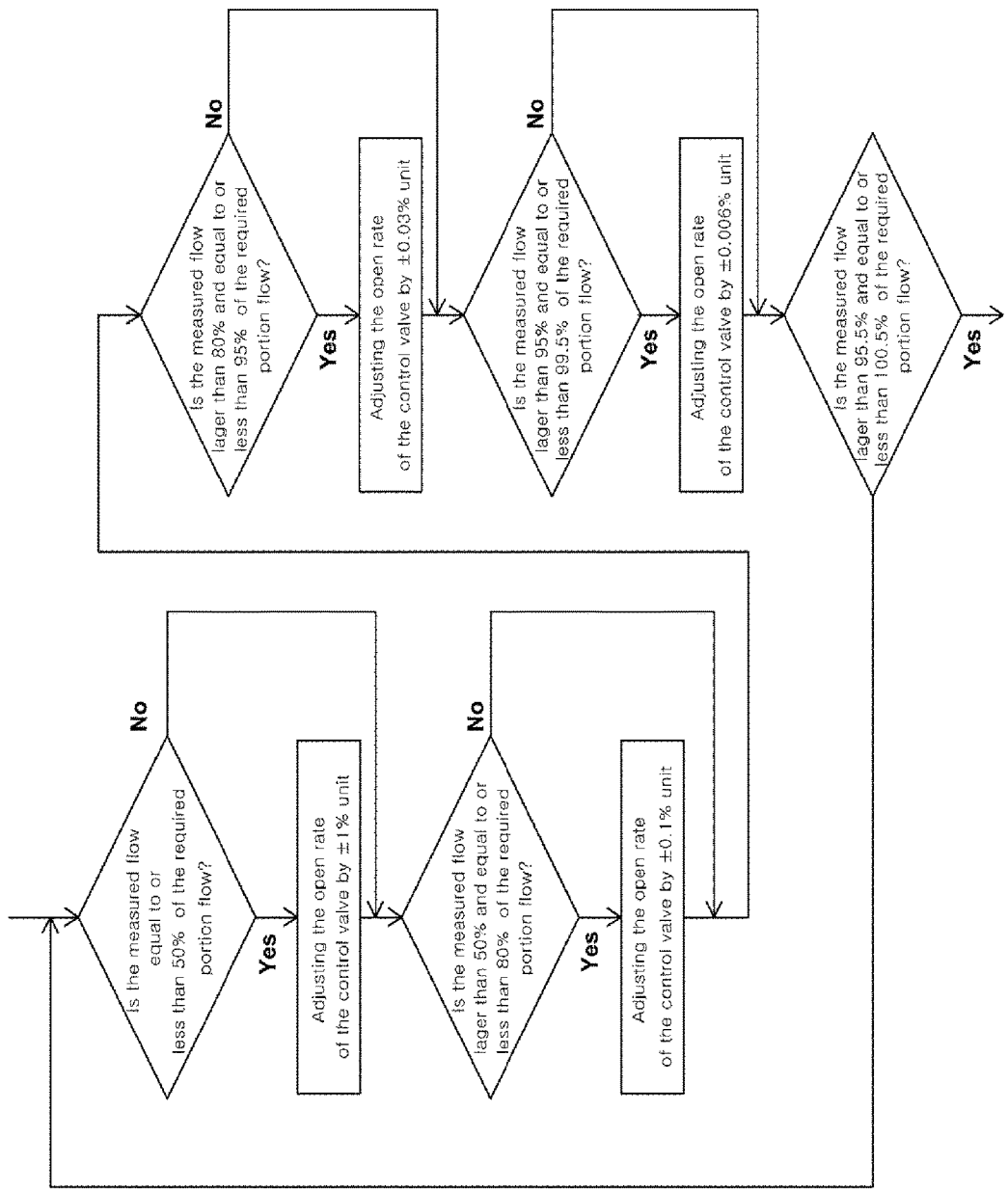

FIGS. 4 and 5 are a flowchart illustrating the first control manner of the controller illustrated in FIG. 2. In the above, if the total of supply flow is more than the total of required flow by the predetermined value, the first control manner illustrated in FIGS. 4 and 5 may be applied. First, if the control valve is fully opened, the open rate of the control valve is set to 50% and if the control valve is fully closed, the open rate of the control valve is set to 30%. In this example, 50% and 3% is exemplary values and different values can be applied as needed and the set open rate of the control valve at full open (for example, 50%) may be larger than the set open rate of the control valve at full close (for example, 3%).

Then, if the control valve is neither in the full open state nor in the full close state, the controller controls the control valve according to the rate of the measured flow to the required portion flow in each branch line. Particularly considering, the required portion flow means the gas flow to be supplied via each branch line, and the measured flow means the flow actually discharged from the each branch line as sensed by the flow meter installed on each branch line. The controller can adjust the measured flow to the approximate level of the required portion flow by adjusting the open rate of the control valve when the above rate is not within a predetermined range (for example, more than 99.5% and equal to or less than 100.5%). The larger a unit of adjusting the open rate may be, the less the rate is (or the larger a difference between the measured flow and the required portion flow is). Thereby, the time required to adjust the measure flow (or the discharged flow) to the approximate level of the required portion flow can be minimized.

For example, as illustrated in FIG. 5, if the rate is equal to or less than 50%, the controller control the open rate of the control valve based on 1% unit; if the rate is more than 50% and equal to or less than 80%, the controller control the open rate of the control valve based on 0.1% unit; if the rate is more than 80% and equal to or less than 95%, the controller control the open rate of the control valve based on 0.03% unit; and if the rate is more than 95% and equal to or less than 99.5%, the controller control the open rate of the control valve based on 0.006%. At this time, the maximum value of the open rate adjustment unit (for example, 1%) may be less than the set open rate of the control valve when the control valve is in the full close state (for example, 3%). After go through the above processes, the below-described second control manner may be applied.

Figure 6:
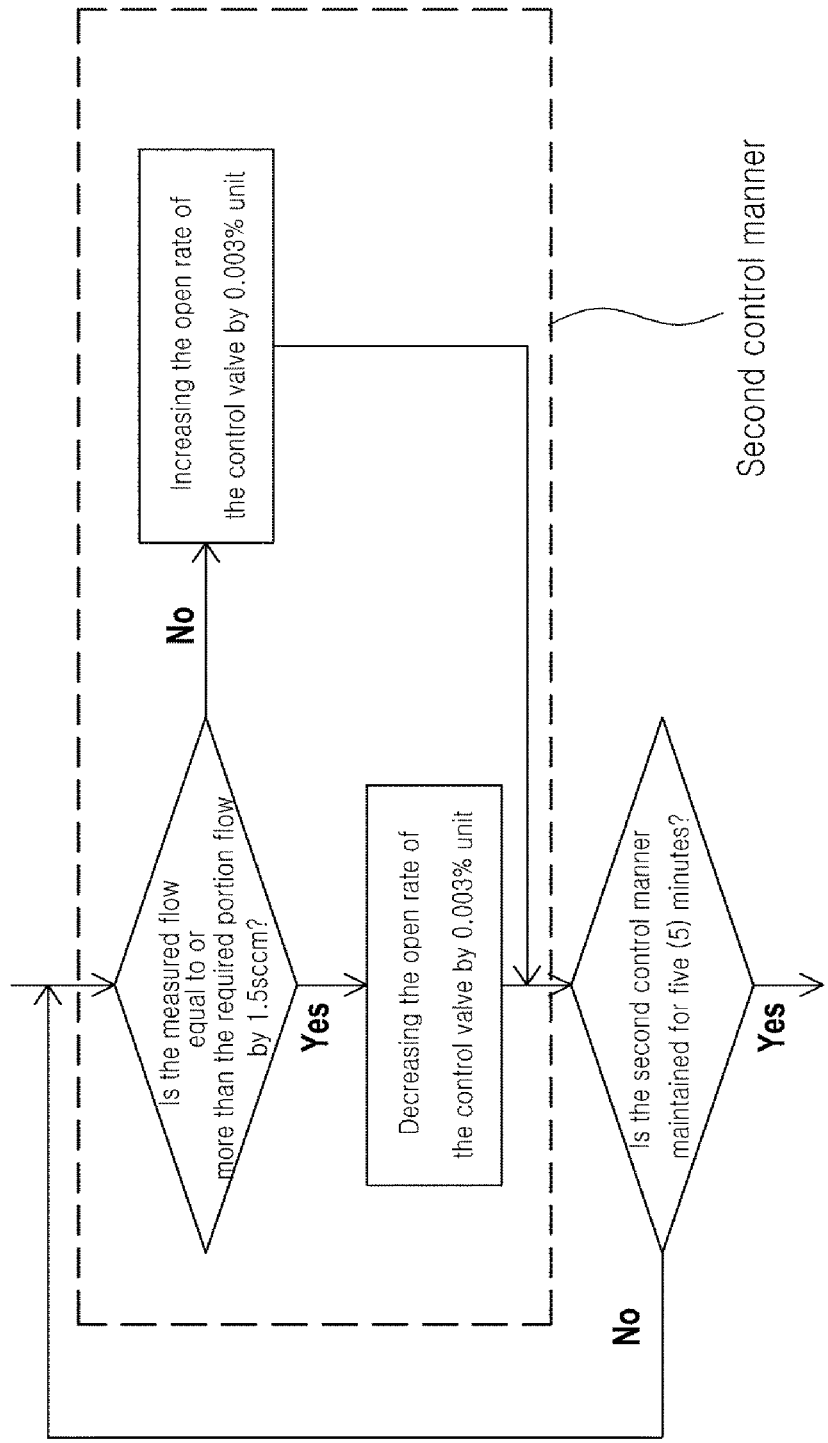
FIG. 6 is a flowchart illustrating the second control manner of the controller illustrated in FIG. 2.

FIG. 6 is a flowchart illustrating the second control manner of the controller illustrated in FIG. 2. The above-described first control manner corresponds to proportional control, which controls based on the rate, while the second control manner corresponds to integral control, which controls based on the deviation.

Based on each branch line, if the discharged flow is equal to or larger by a predetermined value (for example 1.5 sccm) than the required portion flow, the controller decreases the discharged flow by decreasing the open rate of the control valve by a 0.003% unit, and if the discharged flow is less than the required portion flow by a predetermined value (for example 1.5 sccm), the controller increases the discharged flow by increasing the open rate of the control valve by a 0.003% unit. The flow discharged via each branch line can be maintained stably if such processes continue for a certain period (for example, 5 minutes) and thus the control goes into a steady state. That is, when the above process of increasing or decreasing the open rate of the control valve by a 0.003% unit for five (5) minutes, the below-described third control manner may be applied.

Figure 7:
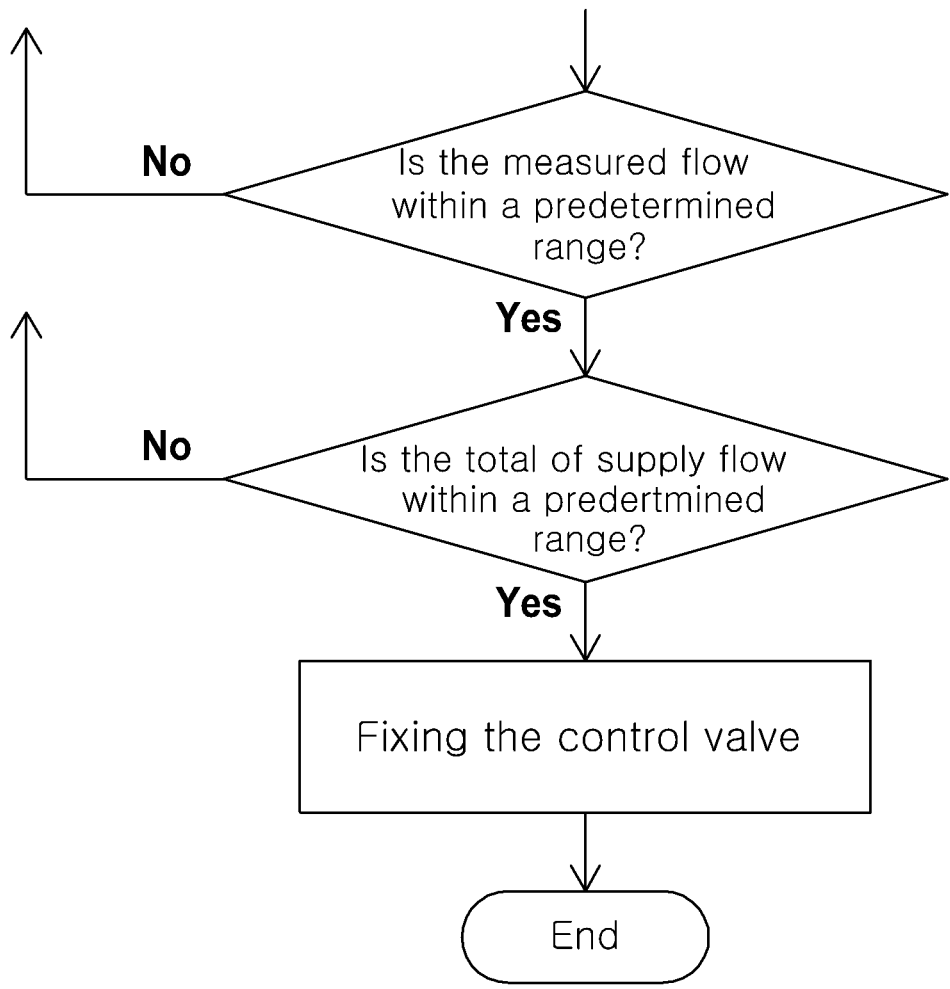
FIG. 7 is a flowchart illustrating the third control manner of the controller illustrated in FIG. 2.

FIG. 7 is a flowchart illustrating the third control manner of the controller illustrated in FIG. 2. First, if the flow measured for each branch line is within a predetermined range (i.e., if the discharged flow is stabilized and the range of fluctuation is not wide), the open rate of the control valve may be fixed. Further, if the total of supply flow, which is the sum of flows measured for each branch line, is within a predetermined range (i.e., if the total of supply flow is stabilized and the range of fluctuation is not wide), the open rate of the control valve may be fixed. However, if the measure flow is not within the predetermined range or the total of supply flow is not within the predetermined range, the above-described second control manner can be applied.

Figure 8:
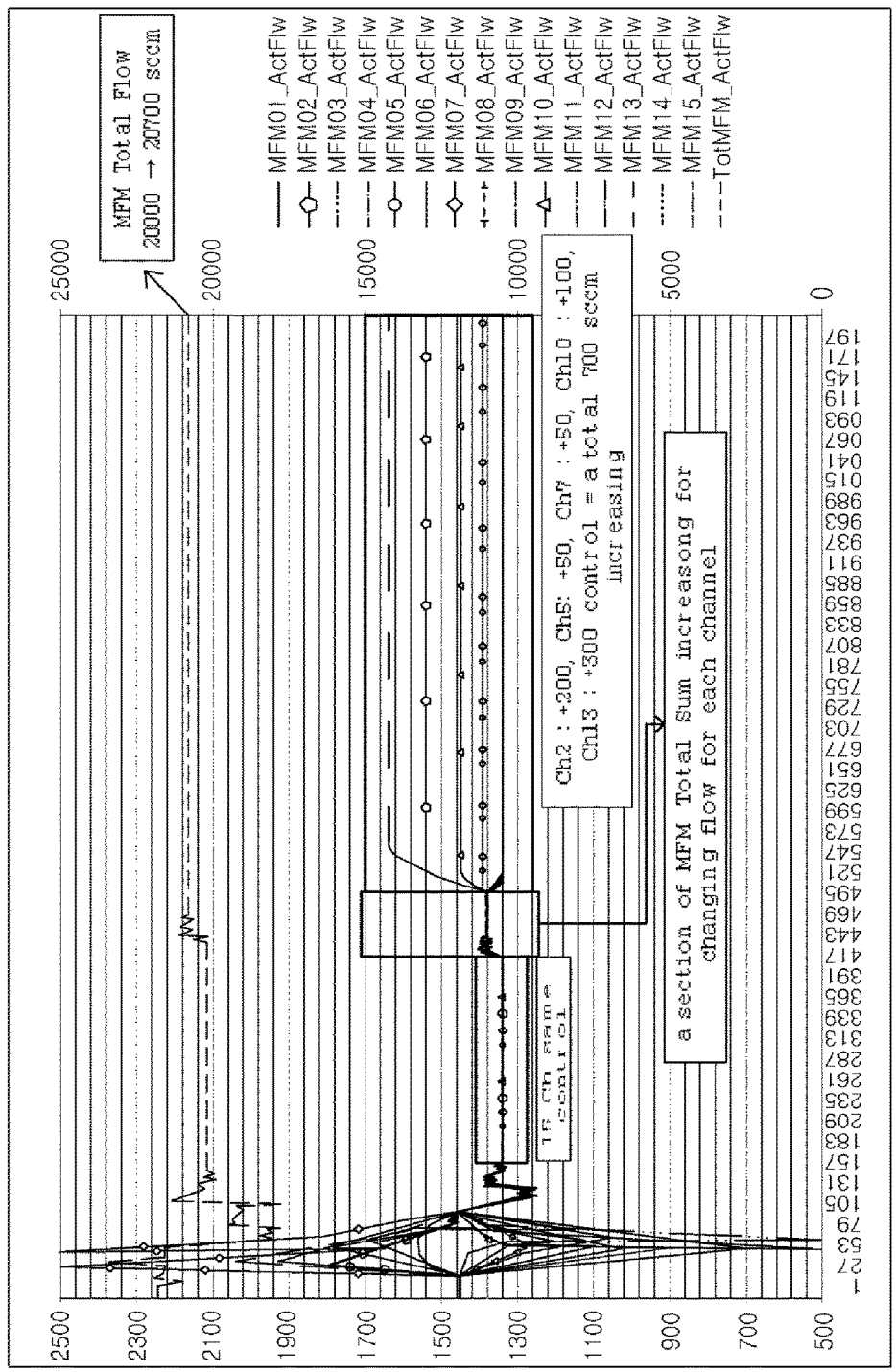
FIG. 8 is a graph illustrating a process for controlling a flow rate in the respective branch lines via the apparatus for multi-supplying gas illustrated in FIG. 1.

FIG. 8 is a graph illustrating a process for controlling a flow in the respective branch lines via the apparatus for multi-supplying gas illustrated in FIG. 1. Considering FIG. 8, fifteen (15) channels (ch) (or branch lines) are initially opened by the same rate (or fully) and the same flow are measured for the respective branch lines if the gas supply is stabilized after the certain period (15 ch same control).

Then, as described the above, the controller compares the total of supply gas with the total of required flow and increases the total of supply gas by increasing the open rate of MFC (mass flow controller) installed on the auxiliary supply line if the total of supply gas is equal to or less than the total of required flow by a predetermined value. That is, a section, in which the total of supply flow being the sum of flows measured via MFM increases, appears.

And then, the controller drives the control valve on each branch line (or each channel) according to the required portion flow and adjusts the open rate of each control valve. As described the above, during the process that the first to third control manners are applied, the inclined sections, in which the flow increases or decrease, appear and then the stabilized section, in which the flow discharged via each branch line is stably maintained, appears if the control goes into a steady state. That is, FIG. 8 illustrates a section, in which the same flow is measured, a section, in which the total of supply flow increases, the inclined section and the stabilized section in order.

Particularly, as indicated in FIG. 8, it may be understood that the total of supply flow increases from 20,000 sccm to 20,700 sccm and it may be identified that the channel 2 increases by 200 sccm, the channel 5 increases by 50 sccm, the channel 7 increases by 50 sccm, the channel 10 increases by 100 sccm, the channel 13 increases 300 sccm, and consequently the total increases 700 sccm.

That is, according to an embodiment of the present invention, without the separate distributor (FRC), the control valve and the flow meter can perform the same function as the distributor and the present invention has an advantage capable of sufficiently controlling even if the total flow increases or decreases.

While preferred embodiments of the present invention has been particularly shown and described with reference to the accompanying drawings, it will be understood by those of ordinary skill in the art that various changes in form and details may be made therein without departing from the spirit and scope of the present invention as defined by the following claims.

Accordingly, it is to be understood that the invention is not to be limited by the disclosed embodiments, but only by the scope of the appended claims.

What is claimed is:

1. A method for multi-supplying gas, the method comprising:
   installing a control valve and an flow meter on each of a plurality of branch lines branched from a main supply line, in which one or more gases are supplied, and supplying the gas; and
   providing the gas by adjusting flow of the gas by a controller connected to each of the control valve and the flow meter,
   wherein the controller has a first control manner, which controls each of the control valves based on a rate of flow measured by the flow meter to a required portion flow for each branch line, and
   the first control manner adjusts an opening degree of the control valve installed in the branch line in which the rate of the measured flow to the required portion flow is not within a predetermined range, and a unit of adjusting the control valve increases or decreases according to a difference between the measured flow and the required portion flow,
   wherein the controller has a second control manner, in which the controller decreases the opening degree of the control valve by a third adjusting unit installed in the branch line in which the flow measured by the flow meter is equal to or more than the required portion flow by a predetermined value, and increases the opening degree of the control valve by the third adjusting unit installed in the branch line in which the flow measured by the flow meter is less than the required portion flow by the predetermined value, and
   wherein the controller has a third control manner, in which the controller fixes the opening degree of the control valve installed in the branch line in which the flow measured by the flow meter is within a predetermined range in a state that the second control manner is maintained for a predetermined period, and the controller returns to the second control manner to the control valve installed in the branch line in which the flow measured by the flow meter is not within the predetermined range.

2. The method of claim 1, wherein before controlling each of the control valves based on the rate of flow in the first control manner, the controller adjusts the opening degree of the control valve which is in a full open state to 50% and adjusts the opening degree of the control valve which is in a full close state.

3. The method of claim 1, wherein the controller calculates a total of supply flow, which is the sum of the flow measured by the entire flow meter, after adjusting each of the control valves to a full open state, and increases an opening degree of an flow controller, which is installed on one or more auxiliary supply line connected to the main supply line and adjusts flow of the gas, if the total of supply flow is equal to or less than a total of required flow, which is the sum of the required portion flow, by a predetermined value.

4. A method for multi-supplying gas, the method comprising:

installing a control valve and an flow meter on each of a plurality of branch lines branched from a main supply line, in which one or more gases are supplied, and supplying the gas; and providing the gas by adjusting flow of the gas by a controller connected to each of the control valve and the flow meter, wherein the controller has a first control manner, which controls each of the control valves based on a rate of flow measured by the flow meter to a required portion flow for each branch line, and the first control manner adjusts an opening degree of the control valve installed in the branch line in which the rate of the measured flow to the required portion flow is not within a predetermined range, and a unit of adjusting the control valve increases or decreases according to a difference between the measured flow and the required portion flow, wherein the controller has a second control manner, in which the controller decreases the opening degree of the control valve by a third adjusting unit installed in the branch line in which the flow measured by the flow meter is equal to or more than the required portion flow by a predetermined value, and increases the opening degree of the control valve by the third adjusting unit installed in the branch line in which the flow measured by the flow meter is less than the required portion flow by the predetermined value, and wherein the controller has a third control manner, in which the controller fixes the opening degree of the entire control valve if a total of supply flow being the sum of the flow measured by the entire flow meter is within a predetermined range in a state that the second control manner is maintained to the entire control valve for a predetermined period, and the controller returns to the second control manner if the total of supply flow is not within the predetermined range.

5. An apparatus for multi-supplying gas, comprising:

a main supply line, in which one or more gases are supplied;

a plurality of branch lines branched from the main supply line and providing the gas supplied from the main supply line;

a plurality of control valves, each installed on each of the plurality of branch lines;

a plurality of flow meters, each installed on each of the plurality of branch lines, located at a rear end of the control valve, and measuring flow of the gas provided via the branch line; and a controller connected to each of the control valve and the flow meter and driving the control valve, wherein the controller has a first control manner, which controls each of the control valves based on a rate of flow measured by the flow meter to a required portion flow for each branch line, and the first control manner adjusts an opening degree of the control valve installed in the branch line in which the rate of the measured flow to the required portion flow is not within a predetermined range, and a unit of adjusting the control valve increases or decreases according to a difference between the measured flow and the required portion flow, wherein the controller has a second control manner, in which the controller decreases the opening degree of the control valve by a third adjusting unit installed in the branch line in which the flow measured by the flow meter is equal to or more than the required portion flow by a predetermined value, and increases the opening degree of the control valve by the third adjusting unit installed in the branch line in which the flow measured by the flow meter is less than the required portion flow by the predetermined value, and wherein the controller has a third control manner, in which the controller fixes the opening degree of the control valve installed in the branch line in which the flow measured by the flow meter is within a predetermined range in a state that the second control manner is maintained for a predetermined period, and the controller returns to the second control manner to the control valve installed in the branch line in which the flow measured by the flow meter is not within the predetermined range.

6. The apparatus of claim 5, wherein before controlling each of the control valves based on the rate of flow in the first control manner, the controller adjusts the opening degree of the control valve which is in a full open state to 50% and adjusts the opening degree of the control valve which is in a full close state.

* * * * *